United States Patent
Scheuerlein

(10) Patent No.: US 7,307,268 B2
(45) Date of Patent: Dec. 11, 2007

(54) STRUCTURE AND METHOD FOR BIASING PHASE CHANGE MEMORY ARRAY FOR RELIABLE WRITING

(75) Inventor: Roy E. Scheuerlein, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 139 days.

(21) Appl. No.: 11/040,262

(22) Filed: Jan. 19, 2005

(65) Prior Publication Data

US 2006/0157679 A1 Jul. 20, 2006

(51) Int. Cl.
*H01L 47/00* (2006.01)

(52) U.S. Cl. ............ 257/2; 257/5; 257/3; 257/E45.002; 365/189.09; 365/163

(58) Field of Classification Search ...................... 257/2
See application file for complete search history.

(56) References Cited

U.S. PATENT DOCUMENTS

| | | | |
|---|---|---|---|
| 5,166,758 | A | 11/1992 | Ovshinsky et al. |
| 5,751,012 | A | 5/1998 | Wolstenholme et al. |
| 5,789,758 | A | 8/1998 | Reinberg |
| 6,034,882 | A | 3/2000 | Johnson et al. |
| 6,369,431 | B1 | 4/2002 | Gonzalez et al. |
| 6,420,215 | B1 | 7/2002 | Knall et al. |
| 6,525,953 | B1 | 2/2003 | Johnson |
| 6,579,760 | B1 | 6/2003 | Lung |
| 6,618,295 | B2 | 9/2003 | Scheuerlein |
| 6,631,085 | B2 | 10/2003 | Kleveland et al. |
| 6,735,104 | B2 | 5/2004 | Scheuerlein |
| 6,856,572 | B2 | 2/2005 | Scheuerlein et al. |
| 6,879,505 | B2 | 4/2005 | Scheuerlein |
| 6,888,750 | B2 | 5/2005 | Walker et al. |
| 2003/0002338 | A1* | 1/2003 | Xu et al. ............... 365/185.11 |
| 2004/0114413 | A1* | 6/2004 | Parkinson et al. .......... 365/100 |
| 2005/0012119 | A1 | 1/2005 | Herner et al. |
| 2006/0097343 | A1* | 5/2006 | Parkinson ................... 257/528 |

OTHER PUBLICATIONS

U.S. Appl. No. 10/326,470, filed Dec. 19, 2002, Herner et al.
Chen, et al. ,"An Access-Transistor-Free (OT/1R) Non-Volatile Resistance Random Access Memory (RRAM) Using a Novel Threshold Switching, Self-Rectifying Chalcogenide Device", *IEDM Technical Digest 37.4*, pp. 905-908 c 2003, (2003),905-908.
Ha,et al. ,"An Edge Contact Type Cell for Phase Change RAM Featuring Very Low Power Consumption", *2003 Symposium on VLSI Technology, Digest of Technical Papers*, (Jun. 2003), 175-176.

(Continued)

*Primary Examiner*—Tu-Tu Ho
(74) *Attorney, Agent, or Firm*—Tyler Thorp

(57) ABSTRACT

A memory array having memory cells comprising a diode and a phase change material is reliably programmed by maintaining all unselected memory cells in a reverse biased state. Thus leakage is low and assurance is high that no unselected memory cells are disturbed. In order to avoid disturbing unselected memory cells during sequential writing, previously selected word and bit lines are brought to their unselected voltages before new bit lines and word lines are selected. A modified current mirror structure controls state switching of the phase change material.

10 Claims, 11 Drawing Sheets

OTHER PUBLICATIONS

Horii, et al. ,"A Novel Cell Technology Using N-doped GeSbTe Films for Phase Change RAM", *Symposium on VLSI Technology Digest of Technical Papers*, (Jun. 2003), 177-178.

Hwang, et al. ,"Writing Current Reduction for High-density Phase-change RAM", *Advanced Technology Development and Process Development, Semiconductor R&D Div., Samsung Electronics Co., Ltd., IEDM Technical Digest 37.1 c 2003 IEEE*, (2003), n/a.

Lai, Stefan., "Current Status of the Phase Change Memory and its Future", Intel Corp., RN2-05, *IEDM Technical Digest 10.1, c 2003 IEEE*, (2003), n/a.

Lai, Stefan., et al. ,"OUM—A 180 nm Nonvolatile Memory Cell Element Technology for Stand Alone and Embedded Applications", *Intel, Corporation, IEDM 36.5 c 2001 IEEE*, (2001), n/a.

Ovshinsky, et al. ,"Innovation Providing New Multiple Functions in Phase-Change Materials to Achieve Cognitive Computing", *Energy Conversion Devices, published about Dec. 14, 2002 by Energy Conversion Devices*, 2956 Waterview Dr. Rochester Hills, MI 48309, 1-12.

Takaura, et al. ,"A GeSbTe Phase-Change Memory Cell Featuring a Tungsten Heater Electrode for Low-Power, Highly Stable, and Short-Read-Cycle Operations", *Central Research Laboratory, Hitachi, Ltd., IEDM 37.2 c 2003 IEEE*, (2003), n/a.

Yi, et al. ,"Novel Cell Structure of PRAM with thin metal layer inserted GeSbTe", *Process Development, Advanced Technology development, CAE Teams, Advanced Process Development PT, Semiconductor R&D Division, Samsung Electronics Co., Ltd., IEDM Technical Digest 37.3 c 2003 IEEE*, (2003), n/a.

\* cited by examiner read bias levels

STRUCTURE AND METHOD FOR BIASING PHASE CHANGE MEMORY ARRAY FOR RELIABLE WRITING

This application relates to Herner et al., U.S. patent application Ser. No. 10/855,784, "An Improved Method for Making High-Density Nonvolatile Memory," filed May 26, 2004; which is a continuation of Herner et al., U.S. patent application Ser. No. 10/326,470, "An Improved Method for Making High-Density Nonvolatile Memory," filed Dec. 19, 2002 (since abandoned) and hereinafter the '470 application, both assigned to the assignee of the present invention and hereby incorporated by reference in their entirety.

This application also relates to Scheuerlein et al, U.S. application Ser. No. 11/040,255, entitled "A Non-Volatile Memory Cell Comprising a Dielectric Layer and a Phase Change Material in Series"; to Scheuerlein, U.S. application Ser. No. 11/040,465, entitled "A Non-Volatile Phase Change Memory Cell Having a Reduced Thermal Contact Area"; and to Scheuerlein, U.S. application Ser. No. 11/040,256, entitled "A Write-Once Nonvolatile Phase Change Memory Array"; all filed herewith and incorporated herein by reference.

BACKGROUND OF THE INVENTION

The invention relates to programming and reading a nonvolatile memory cell comprising a dielectric and/or diode and a phase-change element in series. then voltage is decreased slowly, the material will follow the characteristic curve "to set state S" as the material cools and crystallizes into a low resistance state.

Phase-change materials such as chalcogenides have been used in nonvolatile memories. Such materials can exist in one of two or more stable states, usually high-resistance and low-resistance states. In chalcogenides, the high-resistance state corresponds to an amorphous state, while the low-resistance state corresponds to a more ordered crystalline state. The conversion between states is generally achieved thermally.

Integrated circuit memories are typically large arrays of memory cells connected between bit lines and word lines. In order to achieve reliable programming and reading of the memory cells within the array, memory cells selected to be programmed or read must be isolated from memory cells that are not selected. It sometimes occurs that cells adjacent to selected cells are disturbed during a write operation, or that cells on the same word line or bit line as selected cells may be disturbed during the write operation. This problem becomes increasingly important as operating voltages are decreased, write speeds are increased, memory cell densities are increased, and array sizes are increased.

There is a need for improved methods of programming and reprogramming the memory cells. The cells must be programmed quickly, using low current, and in a manner that assures proper writing and reading of memory cells in the array. One problem when writing and reading memories is that switching occurs very fast, and sometimes a word line or bit line that was recently selected may not have returned to its resting voltage when the next word line or bit line is selected, and selecting a new word line or bit line may cause unintentional programming (or reading) of a cell connected to a previously selected word line or bit line.

SUMMARY OF THE INVENTION

The present invention is defined by the appended claims, and nothing in this section should be taken as a limitation on those claims. In general, the invention is directed to methods of programming an array of nonvolatile memory cells each comprising a phase change element in series with a diode. The invention takes advantage of the one-way nature of the diode and applies biasing voltages that minimize leakage current through unselected cells. The invention preferably follows a preferred order for biasing word lines and bit lines to decrease the likelihood of programming or reading an unselected cell.

BRIEF DESCRIPTION OF THE DRAWINGS

FIG. 5 shows an array incorporating the memory cells of FIG. 4a.

FIG. 8a shows driver circuit 74 of FIG. 8.

FIG. 8b shows detail of sense amplifier 76 of FIG. 8.

DETAILED DESCRIPTION OF PREFERRED EMBODIMENTS OF THE INVENTION

While many solid materials can change between crystalline and amorphous states, in this discussion the term "phase change material" will be used to describe a material that changes relatively easily from one stable state to another. The change is typically from an amorphous state to a crystalline state or vice versa, but may include an intermediate change, such as from a more ordered crystalline state to an indeterminate state to an amorphous state, or vice versa. Phase change material is converted from one state to the other by heating to high temperature, then cooling at a selected rate. Chalcogenides are well-known phase change materials.

It is known to use phase change materials, such as chalcogenides, in a nonvolatile memory cell, in which a high-resistance, amorphous state represents one memory state while a low-resistance, crystalline state represents the other memory state, where memory states correspond to values of 1 and 0.(If intermediate stable states are achieved, more than two memory states can exist for each cell; for simplicity, the examples in this discussion will describe only two memory states.)

Figure 1:
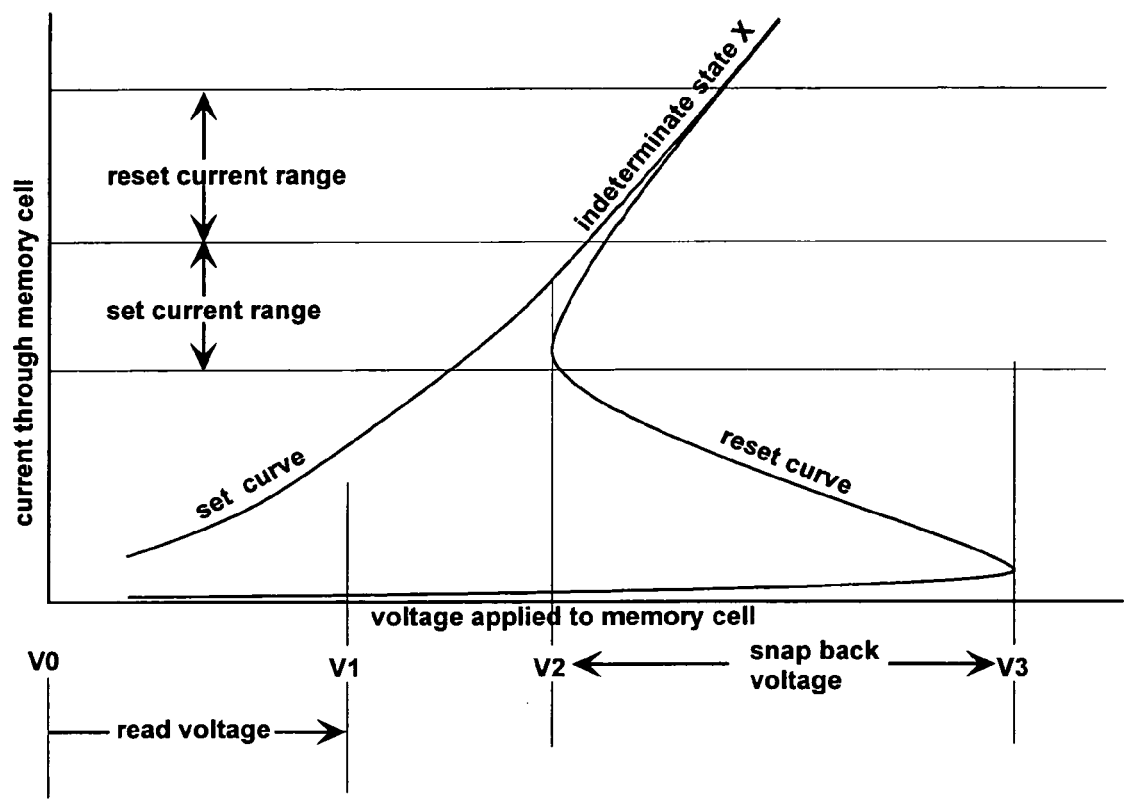
FIG. 1 is a characteristic curve for a two-state memory element such as a chalcogenide.

FIG. 1 shows a characteristic curve for a phase change material such as a chalcogenide. Two curves represent the two states of the material. When the material is in a low resistance state, as voltage is increased, the material follows the "set curve", where a relatively straight line represents a relatively linear relationship between voltage and current. As voltage increases, current correspondingly increases, causing the material to move first through a "set current range" and then a "reset current range" to an indeterminate state labeled "X" in which the material does not exhibit either crystalline or amorphous properties. Alternatively, when the material is in a high resistance state, the material follows the "reset curve", where a voltage increase produces hardly any current until a snap back voltage, labeled V3, is reached. At that point, resistance quickly decreases and the current moves into the "set range". It can be seen that as current increases, the "reset curve" moves closer to the "set curve". Maintaining the current in the "set range" for a sufficient period of time for the material to change to its crystalline state causes the material to converge to the "set curve". Subsequently when the current is reduced from the "set range" the materials cools slowly and the material stays in the set state. In a future programming operation, increasing voltage then causes the material to follow the set curve through the set current range to the reset current range where the two curves coincide at the indeterminate state X. From indeterminate state X, a rapid decrease in voltage and current causes the material to quickly cool and solidify into an amorphous state.

Figure 2A:
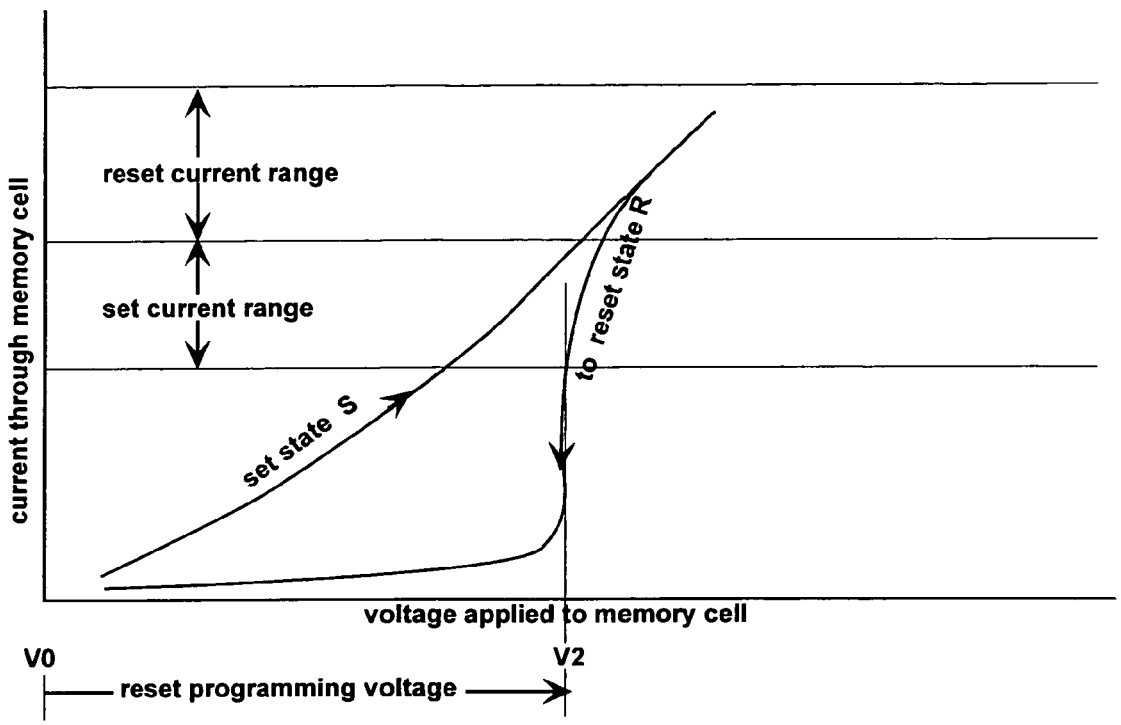
FIGS. 2a and 2b show movement between set and reset states for the memory element of FIG. 1.

FIG. 2a shows that with this rapid cooling, at a voltage labeled V2, current quickly decreases to a low level (as the amorphous state is entered) such that the material now exhibits a high resistance.

Figure 2B:
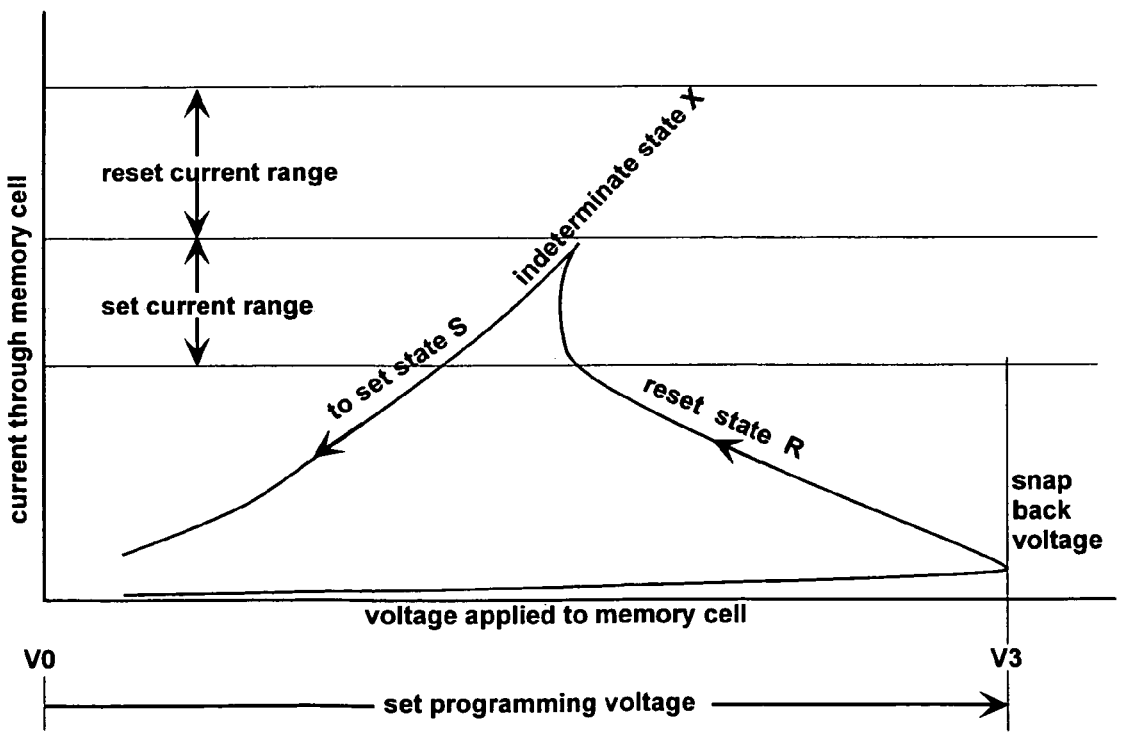

FIG. 2b shows movement along the reset curve of FIG. 1. Starting in the high resistance reset state R, voltage applied to the memory cell produces very little current until the voltage reaches a snap-back voltage V3, at which time voltage across the cell suddenly decreases and current suddenly increases until the set current range is reached. At this point, if the phase change material is allowed to assume its indeterminate state and then voltage is decreased slowly, the material will follow the characteristic curve "to set state S" as the material cools and crystallizes into a low resistance state.

Chalcogenides are particularly useful examples of phase change materials, but it will be understood that other materials, such as silicon, which undergo appropriate and reliably detectable stable phase changes, can be used instead.

Figure 3:
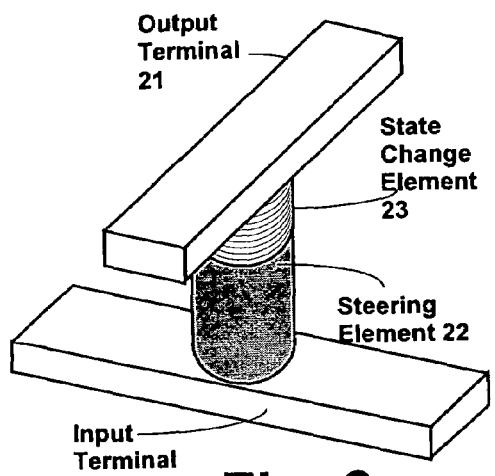
FIG. 3 shows a prior art 3-dimensional memory cell.

FIG. 3 shows a prior art nonvolatile memory cell in which a state change element 23 is placed in series with a steering element 22, such as a diode. Although steering of the signal is assisted by steering element 22, it is necessary to use high current to achieve state change of the entire state change element 23.

Figure 4A:
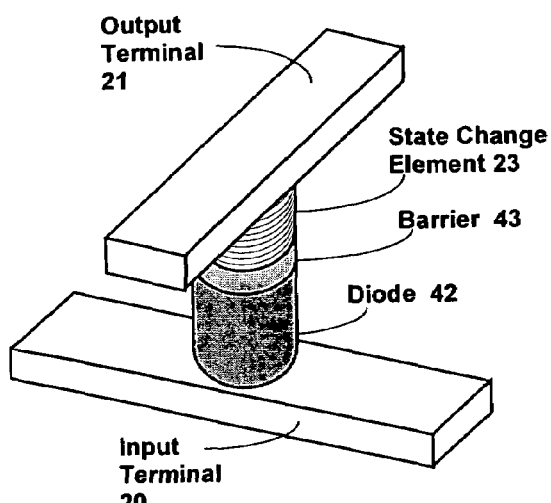
FIG. 4a shows a 3-dimensional memory cell usable with the present invention.

To facilitate conversion, mechanisms have been used to concentrate heat in a relatively small area contacting the phase change material. FIG. 4a shows a memory cell further including a barrier layer 43 for concentrating current into a small area. Such heat concentration is further described by Scheuerlein in concurrently filed U.S. application Ser. No. 11/040,255, entitled "A Non-Volatile Memory Cell Comprising a Dielectric Layer and a Phase Change Material in Series", which has been incorporated by reference herein.

A voltage is applied across the dielectric or barrier layer 43 sufficient to cause dielectric breakdown across the dielectric layer, creating a low-resistance rupture region (or, in some cases, possibly more than one.) The diameter of such a rupture region is very small. A typical rupture region formed by applying a voltage across a silicon dioxide layer about 2 to 3 nanometers thick sufficient to cause dielectric breakdown may be tens of nanometers in diameter.

Such a dielectric layer in which a low-resistance rupture region is formed is an example of an antifuse. An antifuse is characterized by the property of being insulating as formed, preventing current flow; then, when exposed to a high voltage, irreversibly changing its character to become conductive (at least in some regions) and allowing the flow of current.

The very narrow rupture region serves to focus the thermal energy into an extremely small volume, aiding conversion of phase change material in series with the dielectric layer having the rupture region. For example, the dielectric layer having the rupture region and the phase change material may be formed in series, and interposed between conductors. Other elements may exist in the cell, such as a heater layer and a diode.

The barrier layer in the cell of FIG. 4a may be ruptured in a manufacturing environment by applying a high voltage to a selected cell, for example about eight volts in a 2.5 volt system, and grounding the word line. Unselected word lines may be held at about seven volts, and unselected bit lines may be held at about one volt during this rupture process. Preferred methods of rupturing the bits are described in more detail in U.S. patent application Ser. No. 10/403,844 filed by Scheuerlein on Mar. 31, 2003 entitled "Word Line Arrangement Having Multi-Layer Word Line Segments for Three-Dimensional Memory Array", which is incorporated herein by reference.

In some embodiments, all memory cells to be used as addressable memory may be ruptured in this manufacturing step to prepare the memory cells for user program operations. The rupture process may leave the ruptured bits in the reset state or the set state. However, some bits on the chip, usually control bits, may be left not ruptured in this manufacturing step. These portions of the memory may then operate as antifuse memory cells instead of phase change memory cells. The states of these control bits provides permanent data bits useful for various purposes. These antifuse memory cells are useful to control the circuitry on the chip for trimming analog circuits, for imprinting manufacturing information, for setting redundancy address matching information, for bad bit pointer information, for setting a unique device identifier used for copyright protection control techniques, for altering the interface function of the device, for indicating to logic circuits on the chip that portions of the array are locked and the circuitry prevents any further programming of those portions, and for other customizable features of the device. In one embodiment, rupturing these bits requires the use of test inputs that are not possible to activate or access after manufacturing is completed. In one embodiment, the memory line drivers circuits, write circuits, and sense amplifier circuits are shared between the two types of memory bits. In another embodiment, the antifuse cells are in a separate array with separate driver and read-write circuits. In either case the circuitry of FIG. 6, described in more detail below, may be used after manufacture to rupture the antifuse memory cells by increasing the bias levels to the higher voltage levels described above. The antifuse memory bits are read using circuitry shown in FIG. 9 and described in further detail below.

Referring to FIG. 4a, bottom conductor or input terminal 20 is formed of a conductive material, for example a refractory metal or refractory metal compound such as tungsten or titanium tungsten. In this exemplary cell, bottom conductor 20 is in the form of a rail. As shown in FIG. 4a, barrier layer 43 of, for example, titanium nitride may be used between diode 42 and state change element 23. This memory cell contacts an output terminal 21 in the form of a rail-shaped top conductor. Top conductor 21 is preferably perpendicular to bottom conductor 20. In one embodiment shown in FIG. 2 of concurrently filed U.S. application Ser. No. 11/040,255, entitled "A Non-Volatile Memory Cell Comprising a Dielectric Layer and a Phase Change Material in Series" (incorporated herein by reference), the rail shaped conductor 21 is a multilayer structure including a layer of barrier material such as TiN and a layer of phase change material.

The cells just described are just a few examples of the forms that a nonvolatile memory cell formed according to the present invention may take; clearly many other configurations are possible. For example, the memory cell just described includes a non-ohmic conductive element, diode 42, to serve as an isolation device. A non-ohmic conductive element is characterized by a non-linear current vs. voltage curve. Other non-ohmic elements may be used in place of the diode. For example, a metal-insulator-metal (MIM) device consists of two metal (or metal-like) layers separated by a very thin insulator layer. When sufficient voltage is applied, charge carriers can tunnel across the insulator layer, but do not permanently damage it, as in an antifuse. In alternative embodiments of the present invention, the diode 42 of the memory cell could be replaced with a MIM device.

Figure 4B:
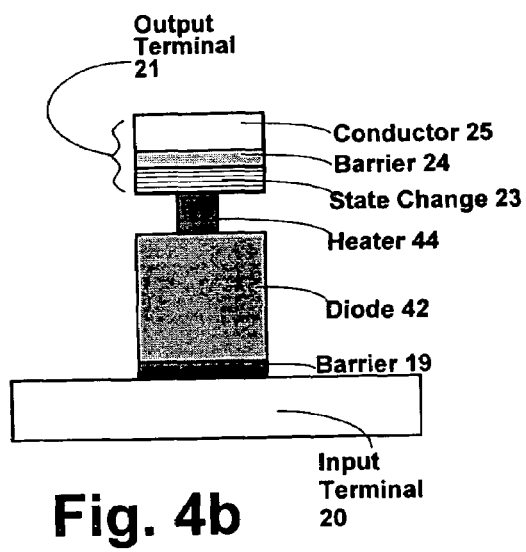
FIGS. 4b and 4c show alternatives to the memory cell of FIG. 4a in which a narrow neck minimizes programming current.

It will be understood, of course, that many variations on the cell of FIG. 4a are possible. The barrier layer 43, phase change layer 23, and diode layer 42 need not appear in the same orientation or order shown in FIG. 4a. As shown in FIG. 4b, a barrier layer 19 of, for example, titanium nitride can be located between input terminal 20 and diode 42, and another barrier layer 24 can be adjacent conductor 25 as part of output terminal 21. State change material 23 can also be part of output terminal 21 and shaped as a rail.

FIG. 4b further shows a memory cell including a laterally etched reduced-area heater layer 44 for concentrating heat into a small area for faster heating with less current. Resistive heater element 44 is formed from a resistive material such as titanium nitride. Such heat concentration is further described by Scheuerlein in U.S. application Ser. No. 11/040,465, "A Non-Volatile Phase Change Memory Cell Having a Reduced Thermal Contact Area," which has been incorporated by reference herein. Lateral etching is used to form a reduced area of layer 44. When current flows through the memory cell, heat is concentrated near the small area of layer 44 and converts a small region of the phase change material 23. With this heat concentration, less energy and less current are required to reach the "set range" and "reset range" of material 23.

Lateral etching of heater element 44 may be achieved by changing the chemistry of etching materials to laterally etch the heater element material, as further explained by Scheuerlein in concurrently filed U.S. patent application Ser. No. 11/040,465.

Figure 4C:
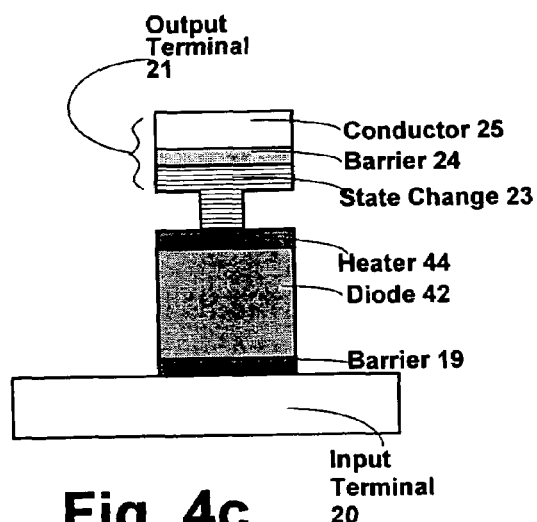

FIG. 4c shows yet another alternative memory cell structure in which the state change material 23 rather than the heater material 44 has been narrowed for more efficient heating to achieve state change. Such a structure may be achieved by forming a narrow post of sacrificial material, filling and planarizing around the narrow sacrificial post, and removing the sacrificial post to expose heater element 44, and applying the state change material 23, which then contacts heater element 44 in a narrow region. The structure of FIG. 4c is also discussed in detail in the above mentioned patent application Ser. No. 11/040,465 incorporated herein by reference. See particularly the discussion of FIGS. 3a-3e of that application.

The barrier layer can be above the phase change material rather than below, for example, or the diode can be above both the barrier layer, heater layer, and phase change layer. In some three-dimensional embodiments with multiple layers of memory cells, both the illustrated and reverse orders of layers are preferably used on different memory layers.

Figure 5:
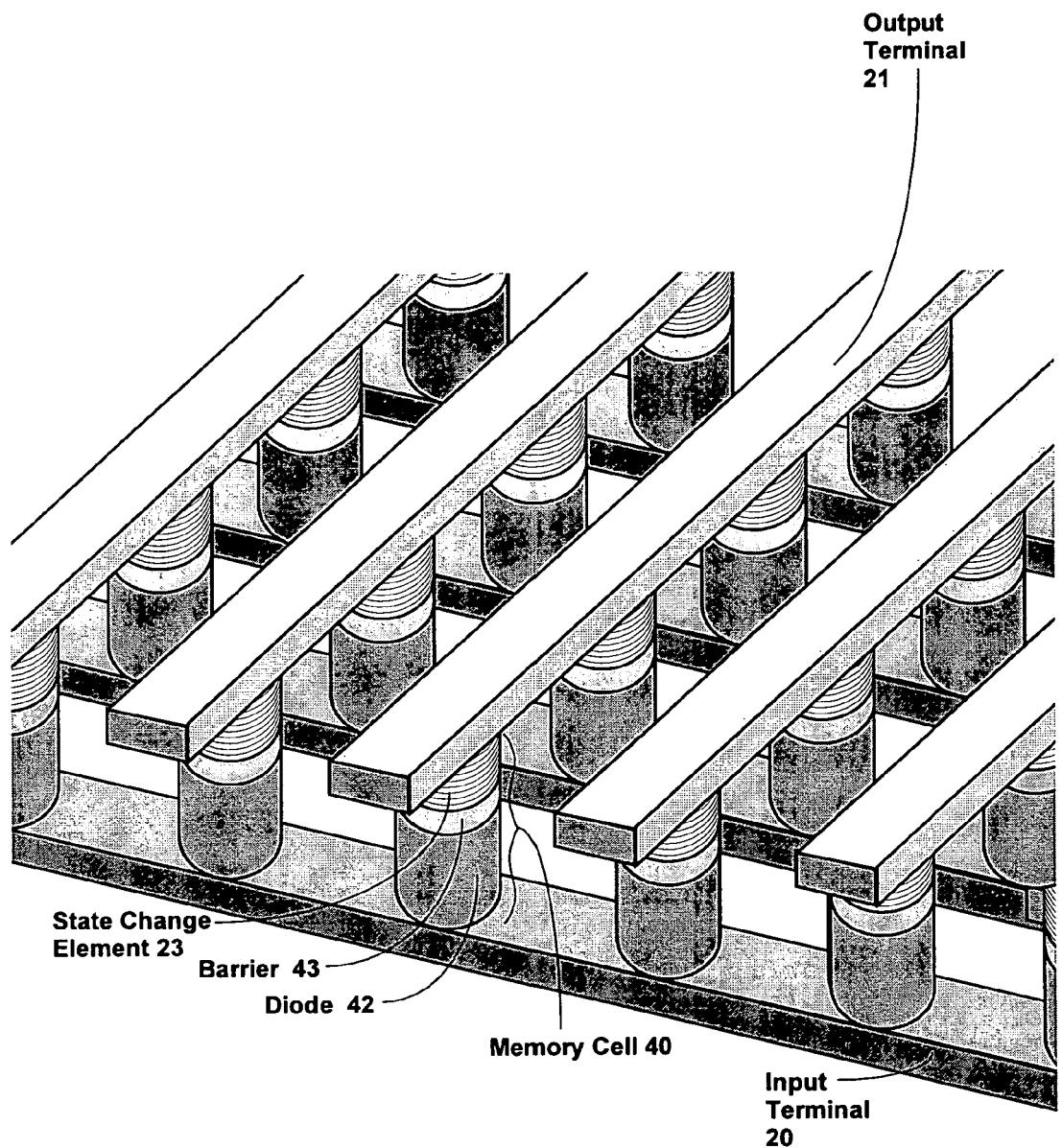

FIG. 5 shows an array incorporating memory cells 40 of the type shown in FIG. 4a. It will be understood, however, that these details are not intended to be limiting, and that many of these details can be modified, omitted or augmented while the results still fall within the scope of the invention. FIG. 5 shows a single memory level. Additional memory levels can be stacked, each monolithically formed above the one below it. Conductive lines in each memory level can be segmented or continuous, and two memory levels can share or not share a conductive line (input or output terminal).

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

While the structure of the array just described diverges in some important ways from the structure of the array of Herner et al., wherever they are the same, the fabrication methods of Herner et al. can be used. For clarity, not all of the fabrication details of Hemer et al. were included in this description, but no part of that description is intended to be excluded.

A layer or element is considered to be in thermal contact with phase change material when thermal events within that layer or element are capable of thermally affecting the phase change material sufficient to cause it to detectably change phase. In some embodiments, it is preferred to place antifuse or heater layers in thermal contact with the phase change material to assist with phase change heating.

Circuitry and Programming

The biasing scheme of the present invention guarantees that the voltage across unselected and half-selected cells is not sufficient to cause inadvertent conversion of those cells, and allows precise control of the power delivered to the cell to be programmed. The biasing scheme also minimizes leakage current through unselected and half-selected cells.

Figure 6:
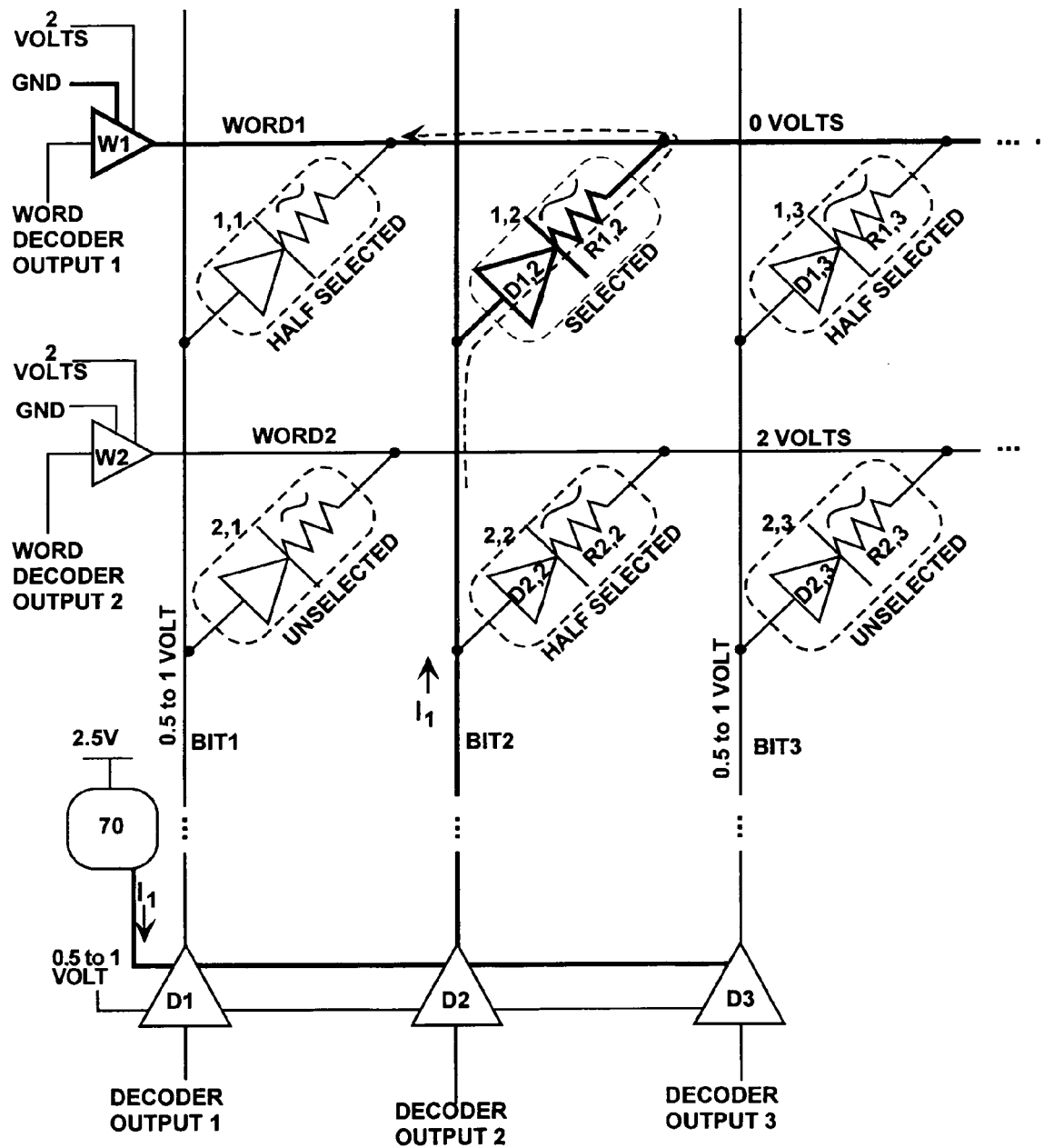
FIG. 6 shows a circuit diagram of memory cells usable with the present invention and programming levels applied according to the invention.

FIG. 6 shows a circuit representation, and may be a representation of an array such as shown in FIG. 5. In FIG. 6, word lines are drawn horizontally and bit lines are drawn vertically. Memory cells are drawn diagonally, and each is shown comprising a diode and a variable resistor. Thus, even though FIG. 6 is drawn as a flat structure, a preferred structure may be a 3-dimensional structure in which word lines are in one layer, bit lines are in another layer, and memory cells are oriented vertically between the layers. It may be preferred to form bit lines and word lines on many layers above a semiconductor substrate to implement an integrated fully three-dimensional memory array. Any antifuse or other barrier material is not shown in FIG. 6, but is preferably included.

In FIG. 6, the diodes of memory cells have their anodes in the direction of the bit lines and their cathodes in the direction of the word lines. A positive voltage is applied to the bit line of the selected memory cell, a negative (or ground) voltage is applied to the word line of the selected memory cell, a voltage close to the positive voltage is applied to unselected word lines, and a voltage close to the negative voltage or ground voltage is applied to unselected bit lines. This combination applies a strong positive voltage to the selected cell while applying small voltages to half selected cells and strong reverse bias to diodes of unselected memory cells.

It is equally workable and equivalent to reverse bit lines and word lines, and to locate the variable resistance phase change material at the anodes rather than cathodes of the diodes.

The particular illustration of FIG. 6 assumes it is desirable to write or read memory cell 1,2, which is labeled "SELECTED". Memory cell 1,2 is connected between word line WORD1 and bit line BIT2. As a novel feature of the invention, by applying a positive voltage of 1.2 volts (for reading) or 2.5 volts (for writing) to bit line BIT2 and applying ground voltage of 0 volts to word line WORD1 while applying a voltage slightly higher than ground voltage to unselected bit lines (shown as bit lines BIT1 and BIT3) and applying a voltage, close to a write voltage, of 2 volts to unselected word lines (shown as word line WORD2), it is possible to write or read memory cell 1,2 without any disturbance of unselected memory cells. This is true even if the actual array is very large. This is also true even if selected memory cell 1,2 starts in a high resistance state, requiring the higher voltage, for example 2.5 volts, to bring the selected cell to its indeterminate state for writing. Note that unselected memory cell 2,3 receives a back biased voltage of 2 volts minus 0.5 to 1 volt or a back bias of 0.5 to 1 volts, not enough to cause a breakdown of diode D2,3 or excessive leakage current through these unselected cells. Half-selected memory cell 1,3 (connected to selected word line WORD1 but unselected bit line BIT3) receives a forward bias of 0.5 to 1 volt, which, depending upon the manufacturing characteristics of diode D1,3 and regardless of the current state of variable resistance R1,3, is less than the forward threshold of diode D1,3. Half-selected memory cell 2,2 receives a bias to diode D2, 2 of 2.5 volts minus 2 volts, which is a forward bias of 0.5 volts. Preferably, the forward bias will be less than the threshold of the diode, which is easily achieved by simply selecting the voltages carefully. The threshold of a diode is the voltage across the diode at which measurable current begins to flow, and below which current is negligible even when summing a thousand or more half-selected cells on a bit line or word line. Although this discussion has used a 2.5-volt power supply, lower voltages may be preferred for smaller geometry memory cells. For example, voltages of 1.5 volts for WRITE and 0.75 volts for READ may be preferred for sub-100-nanometer technology. Also, higher voltages may be preferred for larger geometry memory cells.

Thus, it can be seen that the biasing scheme of the present invention produces good isolation of unselected memory cells from the selected memory cell (or cells) and satisfactory isolation of half-selected memory cells. Since completely unselected memory cells (the majority in an array) are all back biased, leakage current through this large number of cells is minimized. Any forward biasing of half-selected memory cells will be below the diode turn-on threshold, and limited to one or a few selected bit lines or word lines. Therefore, even for memory cells in a low-resistance state, leakage will be negligible.

To apply respective programming voltages, bit line drivers D1, D2, and D3 (and many more not shown) select between the unselected voltage of 0.5 to 1 volt and the selected voltage of 2.5 volts, as controlled by decoder outputs. In FIG. 6, decoder output 2 causes driver D2 to select the 2.5 volt voltage while decoder outputs 1 and 3 cause drivers D1 and D3 to select the 0.5 to 1 volt voltage. Similarly, word line decoder outputs 1 and 2 cause word line driver W1 to select the ground voltage GND and word line driver W2 to select 2 volts. Structure for making these voltage selections is further described in connection with FIG. 5 of commonly owned U.S. patent application Ser. No. 10/306,887 filed Nov. 27, 2002 by Roy E. Scheuerlein, the subject matter of which is incorporated herein by reference.

Programming

To convert a chalcogenide in a crystalline, low-resistance state to an amorphous, high-resistance state, the chalcogenide must be brought to a high temperature, for example about 700 degrees C., then allowed to cool quickly. The reverse conversion from an amorphous, high-resistance state to a crystalline, low-resistance state is achieved by heating to a lower temperature, for example about 600 degrees C., then allowing the chalcogenide to cool relatively slowly. Circuit conditions are carefully controlled in a monolithic three dimensional memory array formed according to a preferred embodiment of the present invention to avoid inadvertent conversion of the chalcogenide of neighboring cells during programming of a cell, or during repeated read events.

Programming the cell may change it from the first state to a second state (low to high resistance or high to low resistance). The cell can subsequently be "erased", returning it to the first state.

Figure 7:
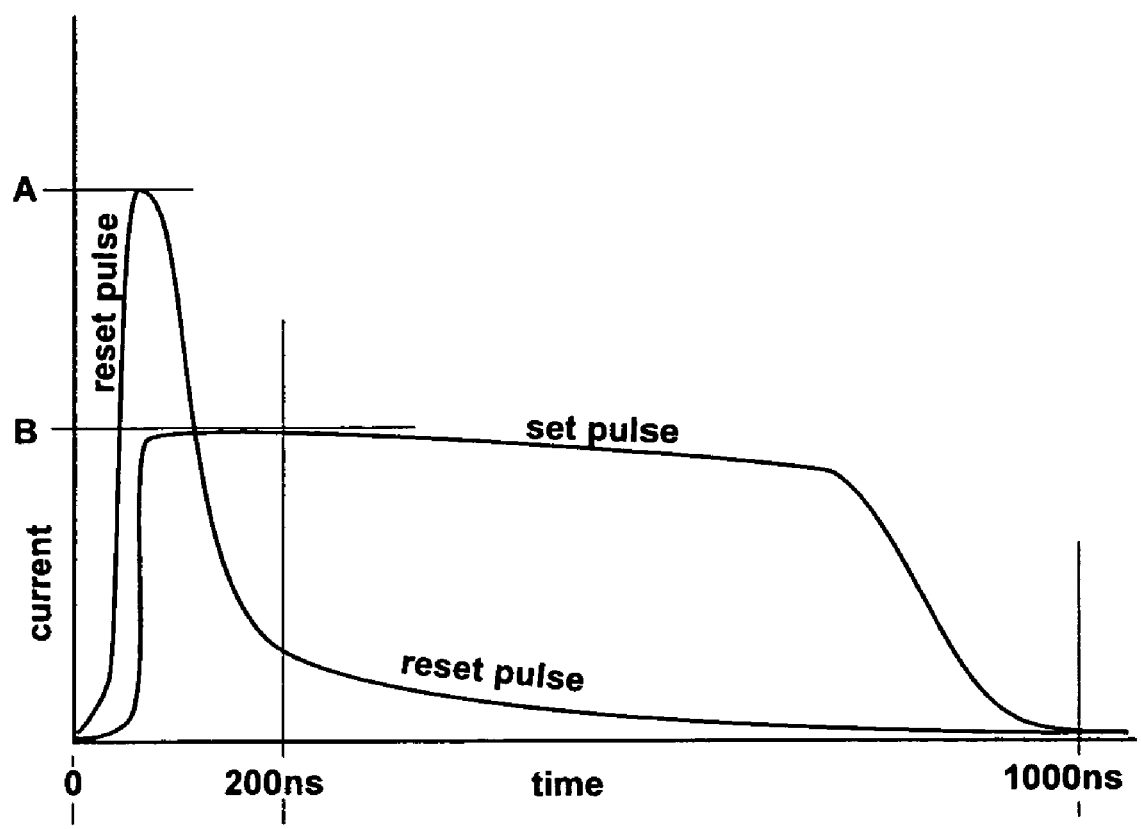
FIG. 7 shows set and reset pulses applied in conjunction with the present invention.

FIG. 7 shows shapes of pulses used to bring phase change material from one state to another.

For writing a logic 1 (set) into a memory cell, current is brought to an intermediate level (set pulse), and held at the intermediate level for a sufficient time for the crystalline structure of the phase change material to develop. In one embodiment, for one chalcogenide material that period of time is on the order of 500 to 1000 nanoseconds (0.5 to 1 microsecond). Current depends upon processing conditions and varies widely. In one embodiment, current through a single cell is about 20 microamps for setting (programming a logic 1) and about 100 microamps for resetting (programming a logic 0).

For writing a logic 0 (reset) into a memory cell, current is brought to a higher level (reset pulse), then quickly removed, so that the reset pulse lasts on the order of 200 nanoseconds. This high current followed by rapid cooling puts the material into an amorphous state with high resistance.

Current and Pulse Width Control

Figure 8:
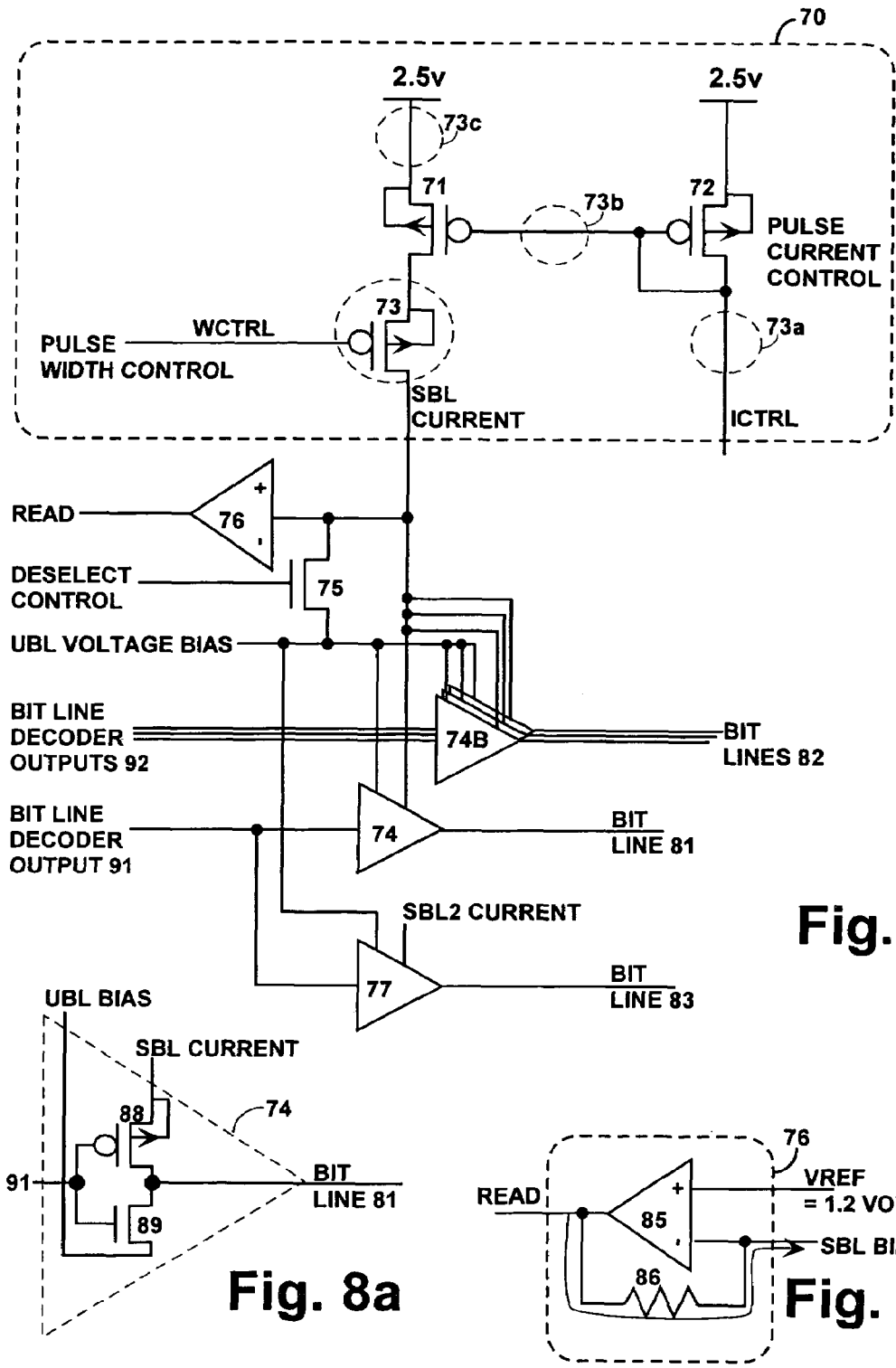
FIG. 8 shows a circuit for applying a selected pulse width and current to a selected cell for switching the cell between high and low resistance states.

FIG. 8 shows circuitry for programming and reading the memory array described in connection with FIG. 6. FIG. 8 illustrates a circuit 70 for controlling both pulse width and current used for writing to selected memory cells. In order to control both the current and the pulse width to the two values A and B for both setting and resetting as shown in FIG. 7, a current mirror circuit 70 includes a pulse width control transistor 73 as well as conventional current mirror transistors 71 and 72. Circuit 70 receives both a current control signal ICTRL in its master arm and a pulse width control signal WCTRL for controlling transistor 73 in series with its slave arm. In another embodiment, a pulse width control transistor is located in series with the master arm, as indicated by 73*a*. In yet another embodiment, the pulse width control transistor is located between the master and slave arms as indicated by 73*b*. Alternatively, the pulse width control transistor may be located between the slave current mirror device and the supply voltage connection, as indicated by 73*c*.

When current mirror circuit 70 is to apply a WRITE signal to a selected bit line, a bit line decoder selects, from the many bit lines (typically over 1000), one or more bit lines on which memory cells are to be written. Typically, a WORD of 8 bits, or some other size, will be written at one time. In the example of FIG. 8, bit line driver 74 is selected by its bit line decoder output 91 to apply a WRITE voltage to bit line 81. Bit line driver 74 receives both an unselected bit line bias UBL and a selected bit line bias SBL. The selected bit line bias SBL is generated by current mirror circuit 70. As a novel feature of the invention, the bit line bias SBL is current controlled, not voltage controlled. Thus a precise current for a precise period of time is applied to the selected memory cell, bringing the selected memory cell to a desired temperature for a selected period and causing the selected value to be reliably written to the selected memory cell.

FIG. 8*a* shows an exemplary circuit for applying SBL and UBL. When active low decoder output 91 applies a high signal, the unselected bit line bias voltage UBL BIAS is applied by driver 74 or 74B to bit line 81 or 82 through an NMOS device 89 so that when bit line 81 is not selected, bit line 81 moves to this UBL voltage. However, when bit line 81 is selected by a low decoder signal 91, the SBL signal line is selected by applying the low voltage to PMOS transistor 88. In this case, when control signal WCTRL turns on transistor 73, the SBL signal is applied to the selected bit line 81. More specifically, when pulse WCTRL is low, a current determined by pulse current control ICTRL is applied as the SBL current through transistor 73 to driver 74 and to bit line 81.

If 8 or 16 bits are to be programmed simultaneously, there will be 8 or 16 circuits 70 each applying its current as determined by its ICTRL for a period of time selected by its pulse control signal WCTRL (to control whether its bit line and selected memory cell will be written with a 0 or a 1). Typically, a single current mirror slave device 71 is associated with a single bit line, though master device 72 can be shared by several current mirror slave devices 71. Two master devices 72, one for the set current and one for the reset current, can control one or more slave devices 71, by means of pass gates not shown, that interrupt the connection between each device 71 and the master device 72. Thus each current mirror slave device 71 provides the desired current for setting or resetting its selected memory cell.

If bit line 81 is to be programmed to a RESET state, a RESET pulse as shown in FIG. 7 is applied by circuit 70 and selected driver 74 to bit line 81. In the case of a RESET pulse, the pulse width control circuit generates a short duration signal WCTRL about 200 ns long while the pulse current control signal ICTRL causes transistor 71 to carry a high current and thus heat the selected memory cell connected to bit line 81 to a high temperature quickly. When WCTRL turns off transistor 73 after about 200 ns, the selected cell moves to an amorphous state with high resistance. If bit line 81 is to be programmed to a SET state, a SET pulse as shown in FIG. 7 is applied by circuit 70 and selected driver 74 to bit line 81. In the case of a SET pulse, WCTRL holds transistor 73 on for about 500 to 1000 ns while ICTRL causes transistor 71 to apply a relatively low current. Thus the selected memory cell converts to a low resistance crystalline state.

Other bit line drivers 74B will also receive this high SBL current, but will not be activated by their bit line decoder outputs, and thus will not apply the selected bit line current SBL CURRENT to their respective bit lines, but will continue to apply the unselected bit line bias voltage UBL BIAS to their bit lines. Therefore these unselected bit lines will not be programmed by current mirror circuit 70.

Other bit line drivers illustrated by driver 77 will also receive the same bit line decoder output 91 as a control input. But these other bit line drivers each receive a separate SBL CURRENT from a corresponding current mirror circuit 70, as represented in FIG. 8 by SBL2 CURRENT. Thus driver 77 illustrates one of several additional drivers for driving different bit lines in response to a single decoder signal for simultaneously writing a multi-bit word.

Order of Programming

One problem when writing and reading memories is that switching occurs very fast, and sometimes a word line or bit line that was recently selected may not have returned to its resting voltage when the next word line or bit line is selected, and a newly selected word line or bit line may cause unintentional programming (or reading) of a cell connected to a previously selected word line or bit line. The order of switching the voltages must be carefully controlled to avoid these unintended results.

For example, regarding FIG. 6, cell 1,2 has been selected by bringing low word line WORD1 while bringing bit line BIT2 high. Other bit lines are at 0.5 to 1 volts and other word lines are at 2 volts, which reverse biases all unselected cells such as cell 2,3. Half-selected cells such as cell 1,1 and cell 1,3 connected to selected word line WORD1 and half-selected cells such as cell 2,2 connected to bit line BIT2 receive a forward bias of about 0.5 to 1 volt, not enough to cause writing to these half-selected cells. However, if the next WRITE operation is to cell 2,3 and bit line BIT3 is brought to 2.5 volts before word line WORD1 has returned to its unselected value of 2 volts, cell 1,3 may be erroneously written. Thus, it is important to assure that all word lines are brought to their unselected voltage before applying bit line pulses to the next bit lines.

It is also important to pull down all unselected or previously selected bit lines and apply the high bit line pulse(s) before pulling down the next word lines, because if any unselected bit lines are still high, pulling down another word line will cause a cell at the intersection between the high but unselected bit line and the newly pulled down word line to be disturbed.

To avoid any disturbances from incomplete switching between sequential writing (or also reading) of memory cells, as a novel feature of the invention, a deselect control device 75 connects a previously connected signal line to the unselected voltage UBL. When pulse width control signal WCTRL has deactivated its pulse through transistor 73, deselect control signal 75 goes high, and causes the unselected bias voltage UBL to be applied to the respective bit line, for example bit line 81 illustrated in FIG. 8. Thus before a next write signal is applied, a previous bit line, 81 in this case, has been pulled to the unselected UBL level, and there is no chance of disturbing this previously selected bit line with the next write signal. Following the example of FIG. 8, if the next memory cell to be accessed is connected to one of bit lines 82, then a corresponding one of bit line decoder outputs 92 causes a corresponding one of bit line drivers 74B to connect the SBL CURRENT node to the corresponding one of bit lines 82. At the time of connection, the selected one of bit lines 82 will be at a voltage close to UBL and will remain at this voltage until the next pulse control signal WCTRL applies current selected by ICTRL to this new bit line 82 (current will be determined by ICTRL depending on whether the new memory cell is to be SET or RESET). Thus, to avoid any disturbance, an effective order of switching is:

- previously selected word lines are pulled to their unselected word line bias;
- previously selected bit lines are pulled to their unselected bit line bias;
- the selected word line is pulled to its selected low level;
- the selected bit lines each receive their selected currents for a selected pulse width, depending on the value to be written;
- the selected bit line voltages are returned to their unselected low levels; and
- the selected word line voltages are returned to their unselected higher levels.

In other cases a group of bit lines connected to a group of bit line drivers such as driver 77 controlled by the same bit line decoder output 91 are not all selected for writing. Some of the group are connected to a circuit 70 with device 73 turned off and their associated deselect control device 75 turned on during the write pulse time for other bits lines in the group. In that way, the number of bit line drivers connected to a bit line decoder output can be larger than the number of selected bit lines. For example 16 bit lines can be controlled by a single decoder, but only 8 of the 16 are selected bit lines. The decoder can be constructed with a width equal to the width taken up by 16 bit lines rather than just 8 selected bit lines. This is particularly useful in 3D memory arrays where the bit lines are constructed on four or even more layers and the width available for the decoder is accordingly reduced to one fourth or even less of the normal width available for a decoder layout. In this case, various bit lines in the group that are controlled by the same decoder receive one of three conditions from their respective SBL CURRENT nodes. The three conditions include 1) a set current, 2) a reset current or 3) for those bit lines not selected, an unselected bit line bias. The bit line drivers in the group pass any of these three conditions to their associated bit lines through device 88 of FIG. 8a.Similarly, not all bit lines in the group are necessarily selected for reading at the same time.

Of course, in other embodiments, diodes are reversed in orientation, and voltage levels are correspondingly reversed. The important factors are to return selected lines to their unselected levels so that all diodes become reverse biased before initiating a next read or write operation. Note that when all cells are unselected, all diodes are reverse biased, thus minimizing leakage, and minimizing the chance that any cells will be erroneously disturbed.

Note that while FIG. 8 illustrates circuitry for applying current to selected bit lines, circuitry is also provided for bringing word line voltages to selected levels. However, since for word lines, selected levels are low rather than high, an n-channel transistors provides a selected word line bias. A circuit for driving array lines and appropriate for driving word lines in the present invention has been illustrated by Roy E. Scheuerlein and Matthew P. Crowley in co-pending Patent Application Publication No. US 2003/0214841 entitled "MULTI-HEADED DECODER STRUCTURE UTILIZING MEMORY ARRAY LINE DRIVER WITH DUAL PURPOSE DRIVER DEVICE", filed Nov. 27, 2002 and incorporated herein by reference. See, for example, FIG. 3 of that application and its discussion.

In one embodiment, several cells, all on one word line but several bit lines, are to be written simultaneously. In this embodiment, timing of word line pulses is sufficient that the selected word line is brought to a low voltage for a time longer than any of the bit line pulses for writing logic 0 (a short high current pulse to the bit line) and logic 1 (a longer lower current pulse to the bit line, see FIG. 7) are applied. The word lines are preferably low resistance lines so that several bits on a word line can be written simultaneously without a voltage swing to the word line that would disturb writing to any of the cells. In some embodiments, the word line is much shorter than a bit line, in one embodiment, about one eighth the length of a bit line.

Reading

Figure 9:
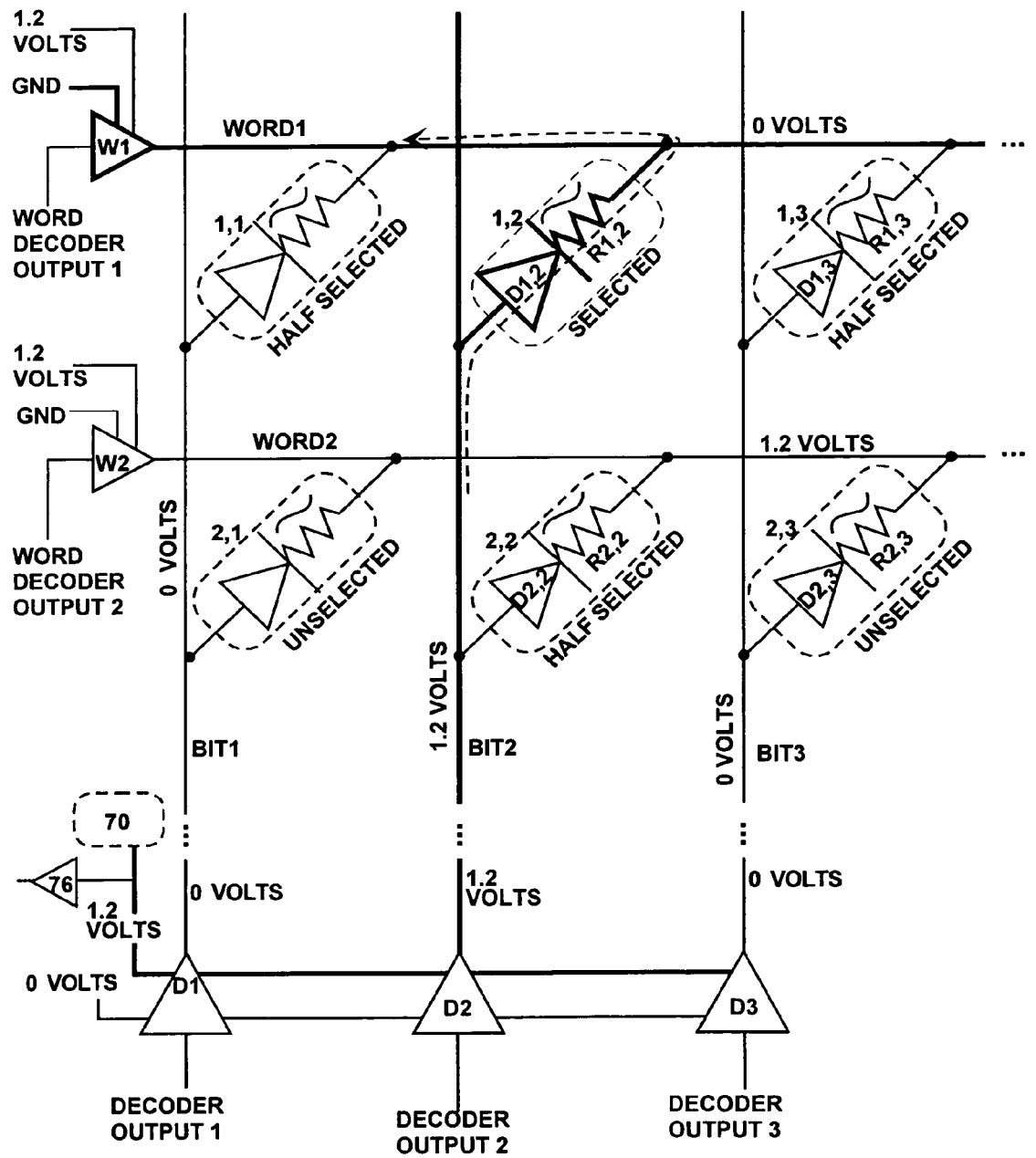
FIG. 9 shows the circuit diagram of FIG. 6 with voltages for reading rather than programming.

Referring back to FIG. 1, one can see that at a READ voltage, V1, it is easy for circuitry to distinguish between the very high resistance and low current of a memory cell in the RESET state (logic 0) and the relatively high current of a memory cell in the SET state (logic 1). This is true if there are no sneak paths through the array that draw current from the selected bit line. Sneak paths are avoided by making the reference voltage VREF of the differential amplifier for reading (see FIG. 8b) equal to the unselected word line bias. FIG. 9 shows such voltages applied to the memory cell array for reading memory cells. As shown in FIG. 9, a voltage of 1.2 volts is applied to unselected word lines such as WORD2 and also to the selected bit line BIT2. Since 1.2 volts is applied to both unselected word lines and selected bit lines, there is no voltage drop through half-selected memory cells such as cell 2,2 and therefore no sneak paths through half-selected cells such as 2,2. For unselected cells such as 2,3 there is only a reverse bias through the diodes of these cells, and therefore the leakage current is too small to affect the bias levels on unselected word lines such as WORD2 even though the number of unselected cells is large.

Operational amplifiers such as 76 shown in FIG. 8 (also 8b) detect current through the cell or cells selected for reading. (To assist understanding of the relationship between FIG. 8 and FIG. 9, FIG. 9 includes current mirror structure 70 and operational amplifier 76 also shown in FIG. 8.)

FIG. 8b shows detail of the operational amplifier 76 of FIG. 8. In FIG. 8b, operational amplifier 85 maintains the SBL BIAS on the minus input of operational amplifier 85 at the level of VREF, which in this example is 1.2 volts. Since feedback resistor 86 connects the READ output voltage to the SBL bias line (which is in turn connected through a driver and bit line to a selected cell), READ current through resistor 86 is substantially equal to current through the selected cell, and therefore indicates the state of the selected cell.

In order to avoid sneak paths through half-selected cells, the two terminals of the half-selected cells may be brought to the same voltage. One simple way to accomplish this is to connect the positive input terminals of operational amplifiers 85 to the voltage supply of unselected word lines. Then operational amplifiers 85 will use feedback resistors 86 to bring the selected bit lines and unselected word lines to the same voltage.

Three Dimensional Array Layout

In the case of a three-dimensional memory array, the group of cells comprising a single word may be located in a vertical stack, and a word line may include segments physically extending through many memory layers connected by vertically oriented vias (sometimes called zias because of their orientation in the z direction). The memory may be arranged such that a plurality of memory cells to be programmed together are connected to a single word line and may be on different layers of memory cells although they are to be programmed in response to a single address. In another embodiment, a word line segment may be shared by memory cells located in memory layers both above and below the word line, thereby reducing the number of word line segments and reducing manufacturing complexity. Bit lines may also be shared by memory cells both above and below.

Figure 10:
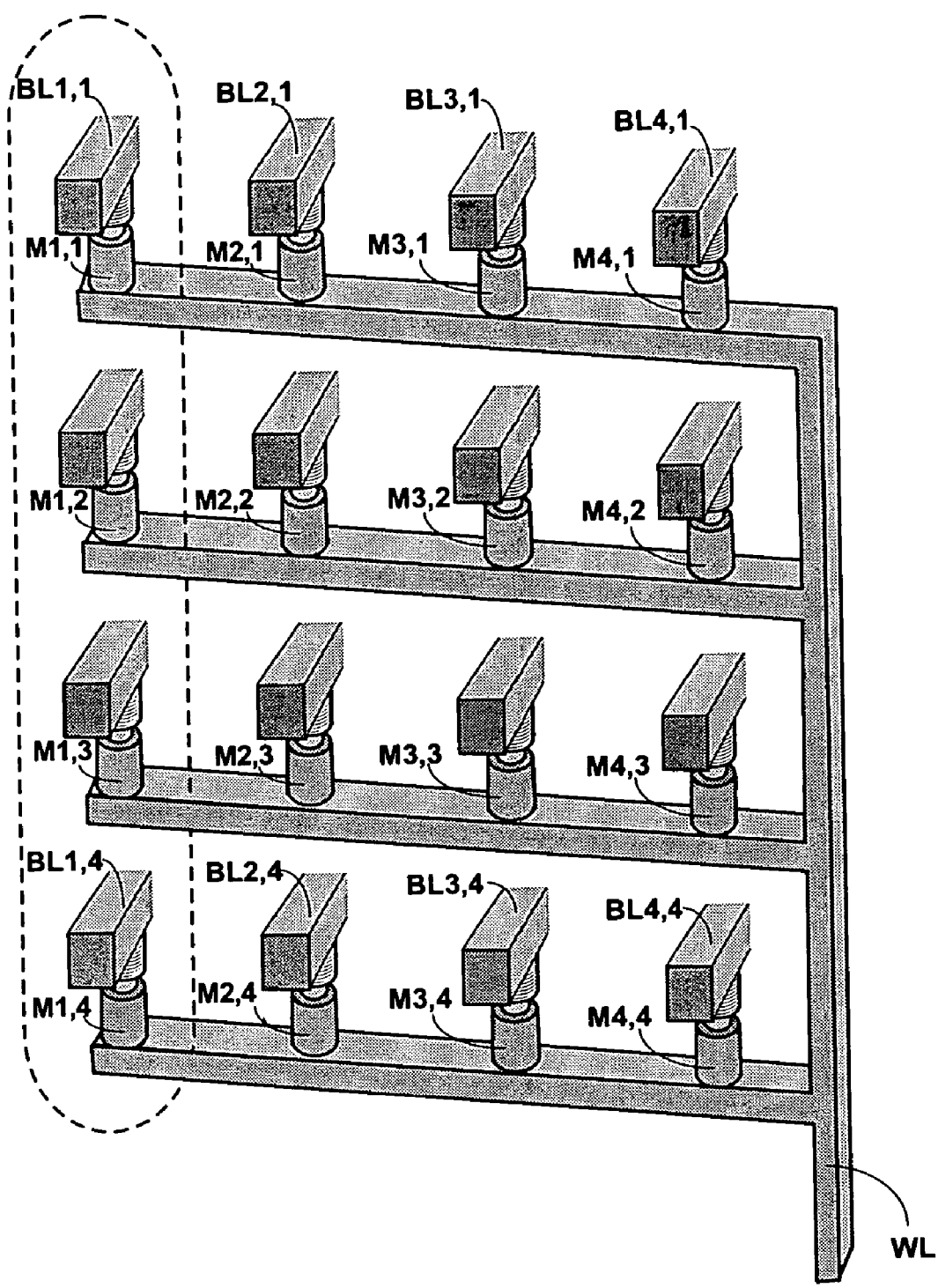
FIG. 10 shows a portion of a 3-dimensional memory array further described in U.S. patent application Ser. No. 10/403,844, showing a useful word line layout.

FIG. 10 shows a portion of a three-dimensional memory array, showing a useful word line layout. Such a structure was also described by Scheuerlein in commonly assigned U.S. patent application Ser. No. 10/403,844 entitled "Word Line Arrangement Having Multi-Layer Word Line Segments for Three-Dimensional Memory Array", which is incorporated herein by reference. FIG. 9 of that patent application shows structure for selecting such a memory block. In the layout of FIG. 10, a word line WL accesses 16 memory cells arranged in a 4 by 4 array on four different memory cell layers within the 3-dimensional integrated circuit memory array. Sixteen bit lines BL1,1 through BL4,4 extend through this 4 by 4 array of memory cells. For simplicity, only a small portion of the bit lines is shown. Additional memory cells such as shown in FIG. 10 are located in front of or behind the sixteen memory cells and bit line portions shown, and are connected to different word lines not shown. The sixteen memory cells shown in FIG. 10 may be considered to be a single word, and a memory WRITE instruction may refer to all sixteen of the memory cells. However, depending upon the current needed for writing to these 16 memory cells, a single current mirror structure such as structure 70 of FIG. 8 may supply the current to sequentially write to, for example, the four memory cells M1,1 through M4,1. A first plurality of memory cells M1,1 through M1,4 may be written simultaneously as controlled by four current mirror structures 70. While word line WL is still low (as described above in connection with FIG. 6), bit lines BL1,1 through BL1,4 are brought to their unselected levels (see above discussion of deselection control transistor 75 of FIG. 8) and bit lines BL2,1 through BL2,4 are selected by their respective bit line drivers (for example one of drivers 74B in FIG. 8) to receive controlled current and pulse width for writing selected values into memory cells M2,1 through M2,4. Subsequently, while word line WL is still selected, the third and fourth columns of memory cells connected to word line WL are written.

In order to speed up the process, it is possible to apply control currents ICTRL to current mirrors 70 that will drive one of the columns in FIG. 10 before the new bit lines are selected and write pulses WCTRL are activated, and while previous bit lines are being brought to their unselected voltage levels by turning on respective transistors 75.

Figure 11:
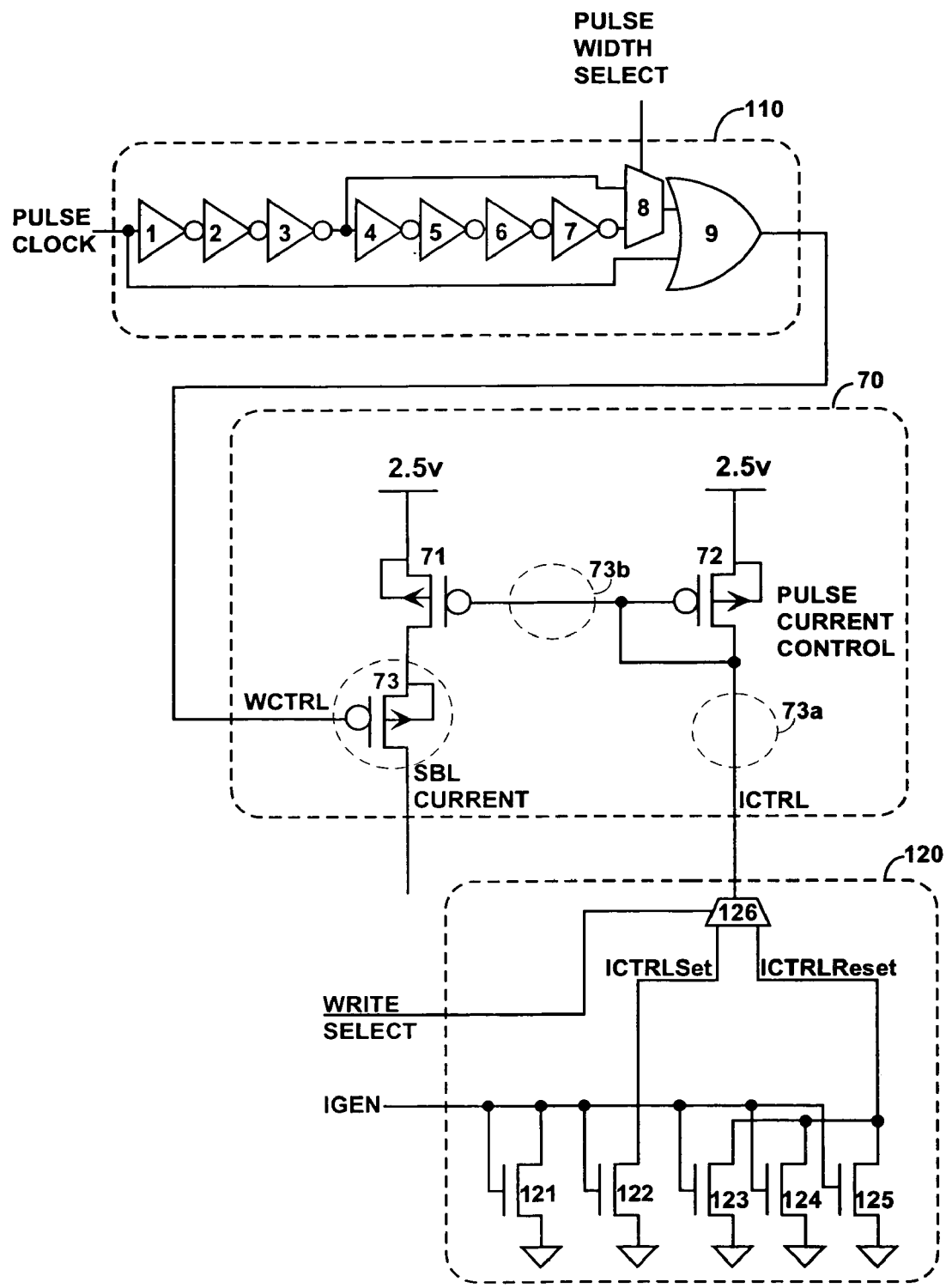
FIG. 11 shows structures for controlling current and pulse width in the current mirror structure of FIG. 8.

FIG. 11 illustrates circuits for providing a selected pulse width WCTRL and a selected current ICTRL to the current mirror 70 of FIG. 8. Pulse width selector circuit 110 includes a string of inverters 1 through 7, with a length selected by pulse width select multiplexer 8. OR gate 9 is a one-shot device that provides a low output signal only when its two input signals are both low. But the input signals are only both low when a low signal has been provided by the PULSE CLOCK input signal and has not yet propagated to OR gate 9 through the string of inverters. Thus the low pulse occurs during this propagation time. Multiplexer 8 allows for two different pulse widths, causing a short pulse width when the PULSE CLOCK signal propagates only through inverters 1-3 and a longer pulse when the signal propagates through all seven inverters 1-7. The pulse lengths can be precisely determined during manufacture by selecting the size and composition of the inverters.

Current select circuit 120 selects between two currents to be applied as ICTRL to current mirror 70. A current generator control signal IGEN controls transistors 121 through 125. Transistor 121 is the master arm for a current mirror in which the slave is either transistor 122 or the combination of transistors 123 through 125. Note that one transistor 122 provides the set control current ICTRLSet through multiplexer 126 as the ICTRL current to pulse control transistor 72 in the master arm of current mirror 70, while three transistors 123 through 125 are connected in parallel to multiplexer 126 to provide the reset current signal ICTRLReset. Therefore ICTRLReset is higher and will cause the slave arm of current mirror 70 to in turn provide a higher reset current as the SBL CURRENT (see also FIG. 8). Multiplexer 126 selects between its two input currents as controlled by the WRITE SELECT control signal. The output of multiplexer 126 in combination with the WCTRL signal determines whether the SBL CURRENT will cause a set (logic 1) or reset (logic 0) to be written to the selected memory cell.

Figure 12:
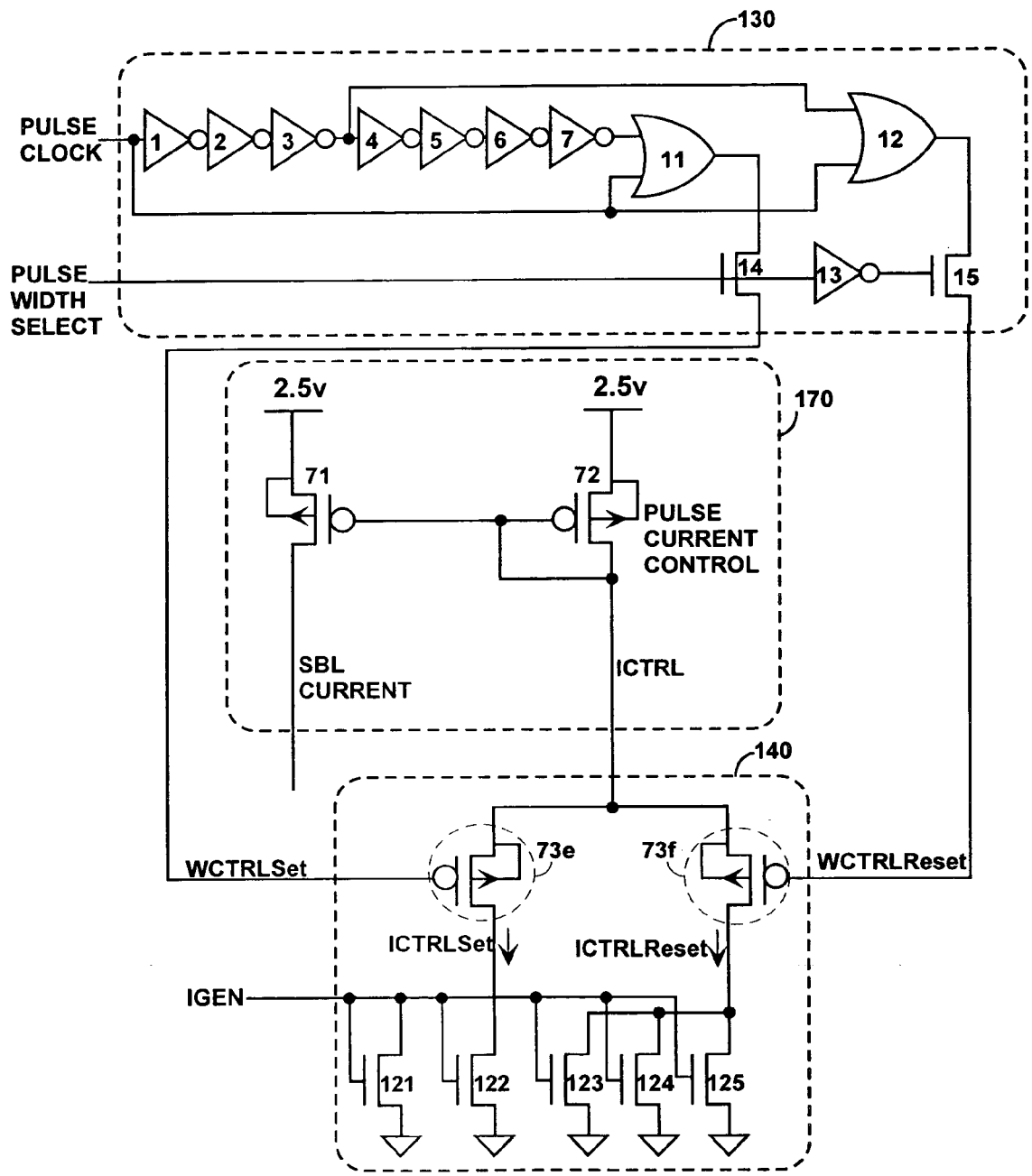
FIG. 12 shows other structures for controlling current and pulse width in the current mirror structure of FIG. 8.

Clearly, other numbers of transistors and other circuits can alternatively accomplish this task. For example, FIG. 12 shows another such circuit. In FIG. 12, current mirror 70 is replaced by a current mirror 170 having no pulse width control transistor. Pulse control is provided by a different pulse width generator circuit 130 having parallel OR gates 11 and 12 providing pulses from inverter strings of different lengths and a different current select circuit 140. The PULSE WIDTH SELECT signal causes one of transistors 14 and 15 to turn on, providing either a SET pulse width signal WCTRLSet to transistor 73e for a low longer ICTRLSet current when a memory cell is to be set, or a RESET pulse width signal WCTRLReset to transistor 73f for a high short ICTRLReset current when a memory cell is to be reset.

In another embodiment, four different unselected bias voltages are provided, one for each bit line layer of each memory sub-array. In this way, unselected bit lines on each layer may be biased independently of unselected bit lines on other layers, the implementation of which is described more fully in connection with FIGS. 8, 9,and 10 of U.S. Pat. No. 6,735,104,entitled "Memory Device with Row and Column Decoder Circuits Arranged in a Checkerboard Pattern Under a Plurality of Memory Arrays", by Roy E. Scheuerlein, which is incorporated herein by reference. As described in this referenced patent, such unselected bias node voltages may be advantageously generated by a group of four unselected bias generator circuits, one associated with each layer. Each such unselected bias generator circuit receives address signals which are used to decode the selected memory plane (i.e., the selected array line layer) to generate bias voltages or conditions appropriately. Furthermore, in a programmable device, additional signals may be received which communicate the mode of operation to the unselected bias generator circuits. For example, the unselected bit line bias voltage may likely be different for read mode than for write mode, and the multi-headed decoder circuits described above may be effectively used in either mode of operation if the decoder provides a decoded output 91 having suitable voltage levels.

In an alternative embodiment, memory line drivers are arranged on opposite sides of the memory array and control alternate memory lines. Since the drivers and not the memory line width control memory line pitch, the memory line pitch can be twice as small as would be allowed by the layout of the memory line driver. Such a layout is illustrated in FIG. 4 of the above referenced U.S. Pat. No. 6,735,104.

In preferred embodiments of the invention each array line driver circuit (i.e., array line decoder "head") preferably includes two transistors, as described herein in connection with FIG. 8a. Nonetheless, other configurations are contemplated for the heads. For example, N-channel transistors may be exclusively used if the various bias conditions lend themselves to such use. Moreover, additional transistors may be employed to accomplish additional functions if layout area permits. While three-dimensional arrays have been discussed in detail, multi-headed decoder circuits are also useful in memory arrays having only one plane of memory cells, although the layout density advantages of multi-headed decoders are more beneficial in three-dimensional arrays having more than one memory plane.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are held at a selected bias level and bit lines are sensed. In this regard, X-lines (or word lines) are frequently, but not always, connected to the cathode terminal of the memory cells, and Y-lines (or bit lines) are frequently, but not always, connected to the anode terminal of the memory cells. Secondly, the memory organization (e.g., data bus width, number of bits simultaneously read during an operation, etc.) may suggest one set of the two array lines is more aligned with data "bits" rather than data "words." As used herein, word lines and bit lines represent orthogonal array lines, and has followed the common assumption in the art that word lines are driven and bit lines are sensed. But the benefits of the invention can be applied either way.

Although, the above discussion focuses on three-dimensional memory arrays, as used herein, a memory array may be a two dimensional (planar) memory array having a memory level formed in a substrate, or alternatively formed above the substrate. The substrate may either be a monocrystalline substrate, such as might include support circuitry for the memory array, or may be another type of substrate, which need not necessarily include support circuitry for the memory array. For example, certain embodiments of the invention may be implemented utilizing a silicon-on-insulator (SOI) structure, and others utilizing a silicon-on-sapphire (SOS) structure. Alternatively, a memory array may be the above-discussed three-dimensional array having more than one plane of memory cells. The memory planes may be formed above a substrate including support circuitry for the memory array. As used herein, an integrated circuit having a three-dimensional memory array is assumed to be a monolithic integrated circuit, rather than an assembly of more than one monolithic integrated circuit packaged together or in close proximity, or die-bonded together.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. U.S. patent application Ser. No. 11/040,256, concurrently filed herewith and incorporated herein by reference, describes memory levels not all having the same type of memory cell, and describes memory levels having cells of one type alternating with memory levels using other types of memory cells. It also describes combining write-many phase change memory cells with programmable read-only memory cells. It is also envisioned that memory cells within the same array can have two modes of operation, one mode in which antifuses in a sub-array of the array have all been ruptured to produce an addressable memory, and another mode in which selected antifuses in another sub-array of the array have been ruptured in a pattern to show identifiable characteristics of the memory such as a serial number, control information, trimming analog circuits, setting redundancy address matching information, or other customizable features of the device. In this case, a useful memory array structure includes memory cells having a phase change element, an antifuse, and a diode, so that any memory cell can be used for either storing frequently re-written data or storing the control information.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. Similarly, the number of array blocks and the number of memory planes are also a matter of engineering decision. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

While certain embodiments have been described in the context of a memory that incorporates a diode as an isolation device in each cell, the teachings of the present invention are believed advantageous for use with memory cells that incorporate any non-ohmic conductive isolation devices such as a MIM device or an organic polymer non-ohmic conductive device as an isolation device in each cell. Such non-ohmic conductive devices are included in the general interpretation of "diode" that has been used in the descriptions and claims.

The foregoing detail has described only a few of the many possible implementations of the present invention. For this reason, this detailed description is intended to illustrate, not to limit. Variations and modifications of the embodiments disclosed herein may be made based on the description set forth herein, without departing from the scope and spirit of the invention. It is only the following claims, including all equivalents, that are intended to define the scope of this invention. In particular, even though the preferred embodiments are described in the context of a chalcogenide phase change material, the teachings of the present invention are believed advantageous for use with other types of memory cells that contain a memory material that is reversibly switchable from one state to another by thermal activation. While certain embodiments have been described in the context of a three-dimensional, field-programmable, memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

What is claimed is:

1. In an integrated circuit comprising an array of memory cells each comprising a diode and a memory material that is reversibly switchable from one state to another by thermal activation, and each connected in series between a word line and a bit line, a method of writing at least one selected memory cell while not disturbing unselected memory cells comprising:
   controlling voltages on word lines and bit lines not connected to the at least one selected memory cell;
   controlling voltage on one of a word line and a bit line connected to the at least one selected memory cell;
   controlling current on another of the word line and bit line connected to the at least one selected memory cell such that the current produces the thermal activation;
   controlling voltage on one of the word line and bit line connected to the at least one selected memory cell comprises controlling voltage on the word line connected to the selected memory cell; and
   controlling current on another of the word line and bit line connected to the at least one selected memory cell comprises controlling current on the bit line connected to the at least one selected memory cell,
   wherein the voltage on the word line connected to the at least one selected memory cell is brought to a lowest voltage applied to the array of memory cells and the current on the bit line connected to the at least one selected memory cell is pulled to a value selected by a current mirror.

2. In an integrated circuit comprising an array of memory cells each comprising a diode and a memory material that is reversibly switchable from one state to another by thermal activation, and each connected in series between a word line and a bit line, a method of writing at least one selected memory cell while not disturbing unselected memory cells comprising:
   controlling voltages on word lines and bit lines not connected to the at least one selected memory cell;
   controlling voltage on one of a word line and a bit line connected to the at least one selected memory cell;
   controlling current on another of the word line and bit line connected to the at least one selected memory cell such that the current produces the thermal activation;
   controlling voltage on one of the word line and bit line connected to the at least one selected memory cell comprises controlling voltage on the word line connected to the selected memory cell; and
   controlling current on another of the word line and bit line connected to the at least one selected memory cell comprises controlling current on the bit line connected to the at least one selected memory cell,
   wherein the voltage on the word line connected to the at least one selected memory cell is brought to a voltage higher than the voltages on bit lines not connected to the at least one selected memory cell, and the bit line connected to the at least one selected memory cell is pulled to a value selected by a current mirror.

3. In an integrated circuit comprising an array of memory cells each comprising a diode and a memory material that is reversibly switchable from one state to another by thermal activation, and each connected in series between a word line and a bit line, a method of writing at least one selected memory cell while not disturbing unselected memory cells comprising:
   controlling voltages on word lines and bit lines not connected to the at least one selected memory cell;
   controlling voltage on one of a word line and a bit line connected to the at least one selected memory cell; and
   controlling current on another of the word line and bit line connected to the at least one selected memory cell such that the current produces the thermal activation,
   wherein controlling voltage on one of the word line and the bit line connected to the at least one selected memory cell comprises controlling voltage on the word line, and
   controlling current on another of the word line and bit line connected to the at least one selected memory cell comprises controlling current on a first bit line connected to a first memory cell and controlling current on a second bit line connected to a second memory cell, and
   wherein controlling current on the first bit line connected to the first memory cell comprises connecting a first current mirror to the first memory cell, and
   controlling current on the second bit line connected to the second memory cell comprises connecting a second current mirror to the second memory cell, and
   wherein writing at least one selected memory cell comprises writing a plurality of selected memory cells.

4. The method of claim 3, wherein the first current mirror and second current mirror cause the phase change material in the first and second memory cells to assume different states.

5. The method of claim 3, wherein the first current mirror supplies a current at least 50% greater than a current supplied by the second current mirror.

6. The method of claim 3, wherein the first current mirror supplies current to the first memory cell for a period at least twice as long as a period during which the second current mirror supplies current to the second memory cell.

7. In an integrated circuit comprising an array of memory cells each comprising a diode and a memory material that is reversibly switchable from one state to another by thermal activation, and each connected in series between a word line and a bit line, a method of writing at least one selected memory cell while not disturbing unselected memory cells comprising:
  controlling voltages on word lines and bit lines not connected to the at least one selected memory cell;
  controlling voltage on one of a word line and a bit line connected to the at least one selected memory cell;
  controlling current on another of the word line and bit line connected to the at least one selected memory cell such that the current produces the thermal activation;
  controlling voltage on one of the word line and bit line connected to the at least one selected memory cell comprises controlling voltage on the word line connected to the selected memory cell; and
  controlling current on another of the word line and bit line connected to the at least one selected memory cell comprises controlling current on the bit line connected to the at least one selected memory cell,
  wherein the voltage on the word line connected to the at least one selected memory cell is brought to a voltage lower than the voltages on bit lines not connected to the at least one selected memory cell, and the bit line connected to the at least one selected memory cell is pulled to a value selected by a current mirror.

8. A method of writing at least one two-terminal memory cell in a non-volatile memory array while not disturbing unselected two-terminal memory cells, the at least one two-terminal memory cell comprising a diode in series with a memory material that is reversibly switchable, the at least one two-terminal memory cell connected between a word line and a bit line, the method comprising:
  configuring a first current mirror to supply a first programming current, the first programming current sufficient to program a first two-terminal memory cell into a set state;
  configuring a second current mirror to supply a second programming current, the second programming current sufficient to program a second two-terminal memory cell into a reset state;
  following the configuration of the first current mirror and the second current mirror, coupling the first current mirror to the first two-terminal memory cell and coupling the second current mirror to the second two-terminal memory cell; and
  following the coupling of the first current mirror to the first two-terminal memory cell and the coupling of the second current mirror to the second two-terminal memory cell, programming the first two-terminal memory cell by applying the appropriate programming pulse width for programming the first two-terminal memory cell into the set state, and programming the second two-terminal memory cell by applying the appropriate programming pulse width for programming the second two-terminal memory cell into the reset state.

9. The method of claim 8, wherein the first two-terminal memory cell and the second two-terminal memory cell begin programming at substantially the same time.

10. The method of claim 8, wherein the first two-terminal memory cell and the second two-terminal memory cell are programmed concurrently.

* * * * *